US010246770B2

United States Patent
Ohmi et al.

(10) Patent No.: US 10,246,770 B2
(45) Date of Patent: Apr. 2, 2019

(54) SILICIDE ALLOY FILM FOR SEMICONDUCTOR DEVICE ELECTRODE, AND PRODUCTION METHOD FOR SILICIDE ALLOY FILM

(71) Applicants: TANAKA KIKINZOKU KOGYO K.K., Chiyoda-ku, Tokyo (JP); TOKYO INSTITUTE OF TECHNOLOGY, Meguro-ku, Tokyo (JP)

(72) Inventors: Shunichiro Ohmi, Tokyo (JP); Yasushi Masahiro, Tokyo (JP)

(73) Assignees: TANAKA KIKINZOKU KOGYO K.K., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 15/573,770

(22) PCT Filed: Jun. 24, 2016

(86) PCT No.: PCT/JP2016/068768
§ 371 (c)(1),
(2) Date: Nov. 13, 2017

(87) PCT Pub. No.: WO2016/208704
PCT Pub. Date: Dec. 29, 2016

(65) Prior Publication Data
US 2018/0148830 A1    May 31, 2018

(30) Foreign Application Priority Data

Jun. 26, 2015   (JP) .................................. 2015-128774

(51) Int. Cl.
C23C 14/58   (2006.01)
C23C 14/18   (2006.01)
(Continued)

(52) U.S. Cl.
CPC .......... *C23C 14/5806* (2013.01); *C22C 27/00* (2013.01); *C22C 28/00* (2013.01);
(Continued)

(58) Field of Classification Search
CPC ....... C23C 14/165; C23C 14/18; C23C 14/35; C23C 14/46; C23C 14/5806; C23C 30/00;
(Continued)

(56) References Cited

U.S. PATENT DOCUMENTS

2008/0093676 A1* 4/2008 Shingu .............. H01L 21/28052
257/386

FOREIGN PATENT DOCUMENTS

JP          7-38104 A      2/1995
JP     2007-173412 A      7/2007
(Continued)

OTHER PUBLICATIONS

PCT, International Search Report for PCT/JP2016/068768, dated Sep. 27, 2016.

*Primary Examiner* — Michael E. La Villa
(74) *Attorney, Agent, or Firm* — Orrick, Herrington & Sutcliffe LLP; Joseph A. Calvaruso

(57) ABSTRACT

The present invention relates to a silicide alloy film that is formed on a substrate containing Si, the silicide alloy film including a metal M1 having a work function of 4.6 eV or more and 5.7 eV or less, a metal M2 having a work function of 2.5 eV or less and 4.0 eV or more, and Si, the silicide alloy film having a work function of 4.3 eV or more and 4.9 eV or less. Here, the metal M1 is preferably Pt, Pd, Mo, Ir, W or Ru, and the metal M2 is preferably Hf, La, Er, Ho, Er, Eu, Pr or Sm. The silicide alloy film according to the present invention is a thin-film which has excellent heat-resistance and favorable electrical property.

5 Claims, 8 Drawing Sheets

(51) Int. Cl.
    H01L 29/45      (2006.01)
    H01L 21/285     (2006.01)
    H01L 21/3205    (2006.01)
    C23C 16/42      (2006.01)
    C22C 27/00      (2006.01)
    C23C 28/00      (2006.01)
    C23C 14/16      (2006.01)
    C23C 14/24      (2006.01)
    C22C 28/00      (2006.01)
    H01L 21/28      (2006.01)
    C22C 30/00      (2006.01)
    C23C 14/14      (2006.01)
    C23C 14/34      (2006.01)
    H01L 29/417     (2006.01)
    H01L 29/78      (2006.01)
    C23C 14/35      (2006.01)
    C23C 14/46      (2006.01)
    C22C 5/04       (2006.01)

(52) U.S. Cl.
    CPC .......... *C22C 30/00* (2013.01); *C23C 14/14* (2013.01); *C23C 14/16* (2013.01); *C23C 14/165* (2013.01); *C23C 14/18* (2013.01); *C23C 14/24* (2013.01); *C23C 14/34* (2013.01); *C23C 14/58* (2013.01); *C23C 16/42* (2013.01); *C23C 28/34* (2013.01); *H01L 21/28* (2013.01); *H01L 21/28052* (2013.01); *H01L 21/28518* (2013.01); *H01L 21/32051* (2013.01); *H01L 21/32053* (2013.01); *H01L 29/417* (2013.01); *H01L 29/456* (2013.01); *H01L 29/78* (2013.01); *C22C 5/04* (2013.01); *C23C 14/35* (2013.01); *C23C 14/46* (2013.01); *Y10T 428/12528* (2015.01); *Y10T 428/12535* (2015.01); *Y10T 428/12875* (2015.01); *Y10T 428/12993* (2015.01)

(58) Field of Classification Search
    CPC ......... C23C 14/24; C23C 28/34; C23C 14/34; C23C 14/58; C23C 14/14; C23C 14/16; C23C 16/42; H01L 21/28518; H01L 29/456; H01L 21/28; H01L 29/417; H01L 29/78; H01L 21/28052; H01L 21/32053; H01L 21/32051; C22C 5/04; C22C 27/00; C22C 28/00; C22C 30/00; Y10T 428/12528; Y10T 428/12535; Y10T 428/12875; Y10T 428/12993
    See application file for complete search history.

(56)           References Cited

FOREIGN PATENT DOCUMENTS

JP      2008-060101 A     3/2008
    JP      2009-277961 A    11/2009
    JP         4409572 B2    11/2009

* cited by examiner

- Formation of SiO₂ by Thermal Oxidation 1100°C / 30 min, 220 nm
- Formation of Activated Region: BHF+DHF
- Injection of P Ion: 5.0×10¹⁵ cm⁻² @30 ke V
- Deposition of SiO₂ in Thickness of 200 nm by RF Sputtering
- Activation Annealing: 1000°C / 1 min
- Formation of Contact Hole
- Formation of Silicide
- Removal of Unreacted Metal
- Formation of Al Electrode
- FGA (Forming Gas Anneal) 400°C / 20 min)

SILICIDE ALLOY FILM FOR SEMICONDUCTOR DEVICE ELECTRODE, AND PRODUCTION METHOD FOR SILICIDE ALLOY FILM

TECHNICAL FIELD

The present invention relates to a silicide alloy film that is applied to a source/drain electrode of a semiconductor device, or the like.

BACKGROUND ART

In a source/drain region on a silicon substrate in a semiconductor device such as a MOSFET, a thin-film including an alloy of a metal and silicon (silicide) is formed on the substrate for formation of a metal/semiconductor junction. The silicide alloy film is formed in the following manner: a metal thin-film is deposited on the substrate by a sputtering method or the like, and a heat treatment is performed, so that silicon is diffused into the metal thin-film to silicify the metal thin-film.

As for the configuration of such a silicide alloy film, titanium silicide (C54 $TiSi_2$) and cobalt silicide ($CoSi_2$) have been generally known previously. However, these silicides are disilicides in which two Si atoms are combined with one metal atom, and thus these silicides involve a relatively large Si consumption. In recent years, an attempt has been made to make the junction depth extremely small in a source/drain region for attaining further miniaturization and thinning in a semiconductor element such as a MOSFET. Application of a silicide that involves a small Si consumption in silicidation is promising for meeting the above-mentioned requirement.

As a silicide capable of meeting the above-mentioned requirement, nickel silicide (NiSi) is used. NiSi is a monosilicide that involves a small Si consumption when formed, has the advantage of low specific resistance, and is therefore expected to be the mainstream of silicides in future.

RELATED ART DOCUMENT

Patent Documents

Patent Document 1: JP 4409572 B2

SUMMARY OF THE INVENTION

Problems to be Solved by the Invention

NiSi is recognized to be the most useful as a silicide alloy film, but has a problem. Specifically, NiSi is poor in heat resistance, and easily makes a transition to $NiSi_2$ as a stable phase in a high temperature range. Transition to $NiSi_2$ causes not only the problem that the Si consumption is increased, but also the problem that the resistance of a silicide region increases, and interface roughness is deteriorated. Thus, it is necessary to strictly control heat treatment conditions in silicidation, so that production efficiency is affected.

In view of the background described above, an object of the present invention is to provide a silicide alloy film which has excellent heat resistance, and is less affected by thermal transformation and which has excellent electrical property in a metal/semiconductor junction state. A material design policy for the silicide alloy film and a specific method for producing the silicide alloy film will be revealed.

Means for Solving the Problems

For solving the problems described above, the present inventors have developed a silicide having a metal with high thermal stability as a base. Examples of the metal as a base include platinum (Pt). Pt is a metal which is well known as a precious metal, and has high thermal stability and chemical stability. PtSi as a silicide of Pt has the advantage that the silicide has excellent heat resistance due to high heat resistance of Pt, and thus a phase structure is not changed even at a high temperature. PtSi is a monosilicide similar to NiSi, and involves a small Si consumption.

According to studies by the present inventors, a metal having high thermal stability as described above tends to have a high work function, and a silicide formed from the metal accordingly has a relatively high work function. Such a silicide may be unsuitable as a silicide for a semiconductor device electrode. For suppressing parasitic resistance, the silicide is preferably one having a similar work function and a small barrier height with respect to Si (n-Si or p-Si) that forms a substrate. Here, Si has a work function of 4.05 eV for n-Si, and 5.12 eV for p-Si. For example, in the case of Pt as described above, Pt has a work function of 5.65 eV, and a silicide of Pt (PtSi) has a very high barrier height of 0.85 to 0.9 eV with respect to n-Si.

As described above, a preferred silicide alloy film has a work function in the vicinity of midgap with respect to Si (n-Si or p-Si). Thus, the present inventors examined whether or not it was possible to adjust a work function by alloying a metal (M2) having a low work function for a silicide of a metal (M1) having a high work function, such as Pt, and resultantly they were able to confirm the effectiveness of the alloying.

That is, the present invention provides a silicide alloy film that is formed on a substrate containing Si, including a metal M1 having a work function of 4.6 eV or more and 5.7 eV or less, a metal M2 having a work function of 2.5 eV or more and 4.0 eV or less, and Si, and having a work function of 4.3 eV or more and 4.9 eV or less.

As described above, the present invention relates to a silicide alloy film, and the silicide alloy film includes a metal (M1) having a high work function, a metal (M2) having a low work function, and silicon (Si). Hereinafter, the configuration of the present invention will be described.

The metal (M1) having a high work function is a metal having a work function of 4.6 eV or more, and specifically, is at least one of Pt, Pd, Mo, Ir, W, Ru and so on. These metals are relatively chemically stable, and have an action of securing heat resistance in formation of a silicide alloy film.

The metal (M2) having a low work function is a metal having a work function of 4.0 eV or less, and specifically, is at least one of Hf, La, Er, Ho, Yb, Eu, Pr, Sm and so on. These metals have an action of adjusting the work function of the silicide alloy film, so that the silicide alloy film has a work function in the vicinity of midgap with respect to Si (n, p) that forms a substrate. That is, the metal M2 is a metal that secures the electrical property of the silicide alloy film as an electrode.

The silicide alloy film according to the present invention includes the metal M1, the metal M2 and Si. Here, the content of Si is 33 at % or more and 50 at % or less. The balance is constituted by metal parts (M1, M2), and the composition ratio of the metal M1 and the metal M2 is adjusted by the required work function of the silicide. The work function of the silicide is set to a work function in the vicinity of midgap with respect to Si (n-Si, p-Si), and as a specific index, the work function of the silicide is set to 4.3 eV or more and 4.6 eV or less for n-Si, and 4.6 eV or more and 4.9 eV or less for p-Si. For obtaining such work functions, the composition ratio of M1 and M2 (M1:M2 (atom ratio)) is adjusted so as to fall within a range of 1:9 to 9:1.

The structure of an alloy crystal that forms the silicide alloy film according to the present invention has as a main body a mixed crystal (having substantially the same meaning as a solid solution) in which the metal M1, the metal M2 and Si are integrated. The silicide alloy film according to the present invention is mainly composed of such a mixed crystal (solid solution), and thus has a work function in the vicinity of midgap with respect to Si. Thus, it is important that the silicide film according to the present invention does not contain a silicide of the metal M1 and a silicide of the metal M2, and if these silicides are contained, the amount of the silicides should be limited. In the present application, the mixed crystal including the metal M1, the metal M2 and Si may be referred to as $M1_xM2_ySi$ (x and y are positive numbers). The silicide of the metal M1 and the silicide of the metal M2 may be referred to as $M1_aSi$ and $M2_bSi$, respectively (a and b are positive numbers).

Here, the silicide alloy film according to the present invention is preferably one in which the limitations of the silicides ($M1_aSi$ and $M2_bSi$) of metals M1 and M2 are defined on the basis of the peak intensities of diffraction peaks derived from the silicides in X-ray diffraction analysis. Specifically, the silicide alloy film is preferably one in which the ratio ((Y+Z)/X) of the sum of the peak intensity (Y) of the silicide ($M1_aSi$) of the metal M1 and the peak intensity (Z) of the silicide ($M2_bSi$) of the metal M2 to the peak intensity (X) of the mixed crystal ($M1_xM2_ySi$) is 0.1 or less. For example, in X-ray diffraction analysis of a silicide film having Pt as M1 and Hf as M2, the limitations of the silicides can be defined by the ratio of the peak intensity (Y) of the PtSi (011) surface and the peak intensity (Z) of the HfSi (011) surface to the peak intensity (X) of the PtHfSi (220) surface. The peak intensity ratio ((Y+Z)/X) is more preferably 0.05 or less. The lower limit of the peak intensity ratio is preferably 0.

In evaluation performed on the basis of a peak intensity ratio in X-ray diffraction, preferably, the crystal surface (Miller index) of each silicide is not limited, and the peak intensity of a crystal surface observable by analysis is referred to. When a plurality of kinds of silicides are generated for each type of silicide, i.e. there exist a plurality of combinations of x and y in $M1_xM2_ySi$, or a plurality of subscripts a orb in $M1_aSi$ or $M2_bSi$, preferably the peak intensities of respective silicides are added up, a peak intensity ratio is then calculated, and the value of the peak intensity ratio is evaluated.

The silicide alloy film according to the present invention is preferably one in which the concentration of C and O as impurities is 5 wt % or less. When the concentration of impurities is more than 5 wt %, the resistance of the silicide alloy film increases, leading to an increase in contact resistance and Schottky barrier height. The impurity concentration is more preferably 3 wt % or less.

Further, the silicide alloy film is preferably one having a root mean square (RMS) roughness of 5 nm or less. The root mean square (RMS) roughness is more preferably 3 nm. This is because it is necessary to reduce a leakage current in a diffusion layer region of a semiconductor device.

A method for producing a silicide alloy film according to the present invention will now be described. The present invention relates to a silicide thin-film, and in a basic process for producing the silicide thin-film, a thin-film including a metal M1 and a metal M2 is formed on a Si substrate, and a heat treatment is performed, so that Si is diffused from the Si substrate into the thin-film to silicify the metal M1 and the metal M2.

A substrate of a semiconductor device usually corresponds to the Si substrate, but a Si layer separately formed on the substrate of the device may be used as the Si substrate. The Si substrate may be either an n-Si substrate or a p-Si substrate.

The thin-film formed on the Si substrate and including the metal M1 and the metal M2 may have a structure in which the metals are stacked in a layered form, or a structure in which both the metals are alloyed. The method for forming the thin-film is not particularly limited, and either a physical method such as a sputtering method or a vacuum vapor deposition method or a chemical method such as a chemical vapor deposition method (CVD method) can be applied, but a sputtering method is preferable.

When the metal M1 and the metal M2 are separately stacked in production of the thin-film by sputtering, a thin-film in a stacked state can be formed by sequentially performing sputtering with use of a target composed of each of the metals. When an alloy thin-film of the metal M1 and the metal M2 is formed, a target to be used is preferably one including an alloy of the metal M1 and the metal M2. The composition of the target may correspond to the composition ratio of the metal M1 and the metal M2 in a silicide to be produced. Examples of the alloy target used here include alloy targets produced by powder metallurgy. In powder metallurgy, fine powders of metals or fine powders of an alloy are molded and sintered to produce an alloy target.

The type of sputtering in formation of the thin-film is not particularly limited, and the thin-film is formed by magnetron sputtering, ion beam sputtering, electron cyclotron resonance (ECR) sputtering, mirrortron sputtering, radio frequency (RF) sputtering, direct-current (DC) sputtering or the like.

The thin-film including the metal M1 and the metal M2 is formed, and then silicified by heat treatment to produce a silicide alloy film. The heat treatment here is performed preferably at 600° C. or lower. This is because it is necessary to perform the heat treatment at a temperature that does not affect the junction depth of the diffusion layer of the semiconductor device. The heat treatment atmosphere is preferably a non-oxidizing atmosphere (vacuum atmosphere, inert gas atmosphere or reducing atmosphere).

In the heat treatment for silicidation of the thin-film including the metal M1 and the metal M2, a protecting layer may be formed for suppression of oxidation of the thin-film, followed by performing the heat treatment (hereinafter, the protecting layer may be referred to as a cap layer). When at least one of the metal M1 and the metal M2 is a metal having low oxidation resistance, it is useful to set the cap layer. As the cap layer, a thin-film including a compound of a metal identical to or different from the metal M1 or the metal M2 can be used. For example, a thin-film of a Ti compound such as titanium nitride (TiN) or titanium carbide (TiC), or a compound of hafnium (Hf) such as HfN, HfW or HfB is useful. The thickness of the cap layer is preferably 10 nm or more and 100 nm or less, more preferably 10 nm or more and 30 nm or less. Since the cap layer is a protecting layer for the thin-film in formation of the silicide alloy film, it is preferable to remove the cap layer after the heat treatment.

Advantageous Effects of the Invention

The present invention relates to an alloy film formed by silicifying a metal M1 and a metal M2 which are different in work function level. By silicifying an alloy as in the present invention, even a metal (M1) having a high work function while having high thermal stability can be formed into a silicide having a work function in the vicinity of midgap with respect to Si (n-Si or p-Si) due to the action of a metal (M2) having a low work function. The silicide alloy film has both heat resistance and electrical property.

DESCRIPTION OF EMBODIMENT

Hereinafter, an embodiment of the present invention will be described.

First Embodiment

In this embodiment, a PtHf silicide ($Pt_xHf_ySi$) alloy film having Pt as a metal M1 and Hf as a metal M2 was produced. Here, a PtHf silicide thin-film was formed on a Si substrate to produce a Schottky diode, and the electrical property of the device was evaluated.

Figure 1:
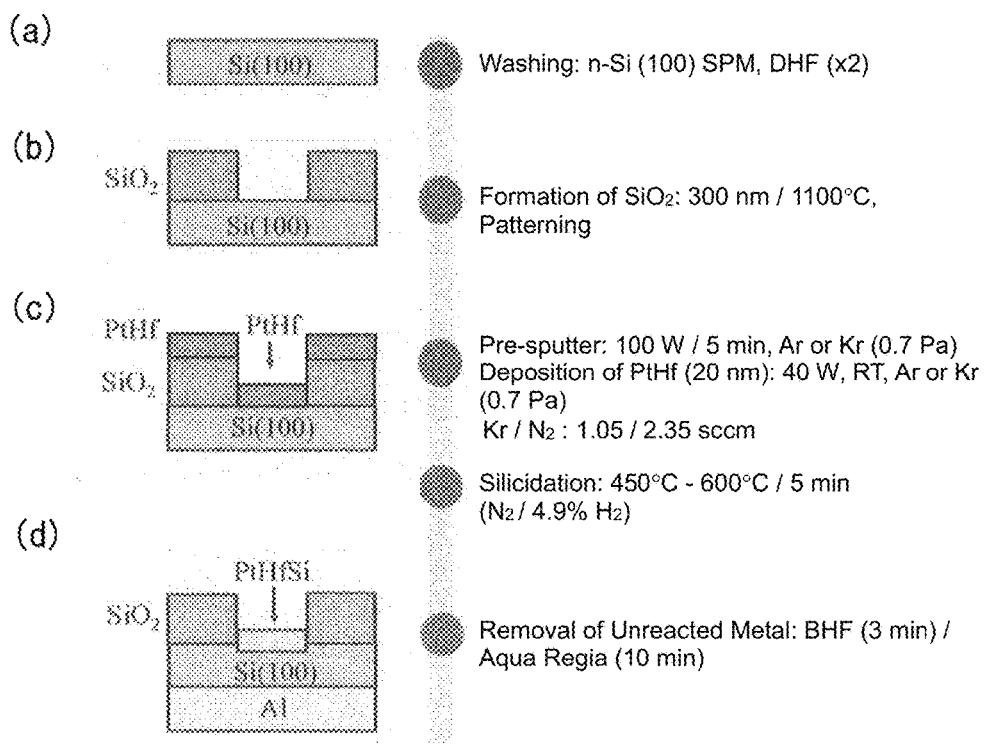
FIG. 1 illustrates a process for producing a device in a first embodiment.

FIG. 1 shows a process for producing a device in this embodiment. In this embodiment, the Si substrate (n-Si (100)) is chemically cleaned (FIG. 1(a)), and then wet-oxidized to form a $SiO_2$ layer, and the layer is etched to perform patterning (FIG. 1(b)). A PtHf alloy thin-film is formed in the layer (FIG. 1(c)).

For formation of the PtHf alloy thin-film, a sintered target including a PtHf alloy was used. The sintered target was obtained by sintering a fine powder of a PtHf alloy. The PtHf alloy powder was produced by arc-melting and alloying high-purity base metals of Pt and Hf to produce a button-shaped ingot, and mechanically crushing the ingot into a powder. The alloy composition ratio here is Pt:Hf=5:2 (at %). The alloy powder was sintered under the condition of 1000 kgf/cm², 1500° C. and 1 hour in a HIP apparatus to obtain an alloy target (dimensions: a diameter of 76.2 mm and a thickness of 2.0 mm).

In formation of the PtHf alloy thin-film, first a substrate surface was cleaned by performing preliminary sputtering (power: 100 W, time: 5 minutes). Thereafter, the PtHf alloy was sputtered. As conditions here, the temperature was room temperature, and the power was 40 W, and under the conditions, the alloy thin-film was deposited in a thickness of 20 nm. In this embodiment, Ar and Kr ions were used as gas ions in sputtering (the pressure of each of these gases was 0.7 Pa).

After formation of the PtHf alloy thin-film, silicidation was performed by heat treatment. As conditions for silicidation, three conditions: 450° C., 500° C. and 600° C. were set for the treatment temperature. The treatment atmosphere was a nitrogen gas, and the treatment time was 5 minutes.

After silicidation of PtHf, an unreacted metal was removed by etching, and an Al electrode was formed to obtain a device (FIG. 1(d)). The etching was performed by use of buffered hydrofluoric acid (BHF) and diluted aqua regia ($HCl:HNO_3:H_2O$=3:2:1, temperature: 40° C.).

Comparative Example 1

As a comparative example to the first embodiment, a Pt thin-film was formed in place of a PtHf thin-film, and silicified to produce a device. Conditions for silicidation, and so on were essentially the same as in the first embodiment (only Ar sputtering was performed).

For the device thus produced, electrical property was evaluated. An evaluation test was conducted by measuring a current density-voltage characteristic (J-V characteristic) by a semiconductor parameter analyzer.

Figure 2:
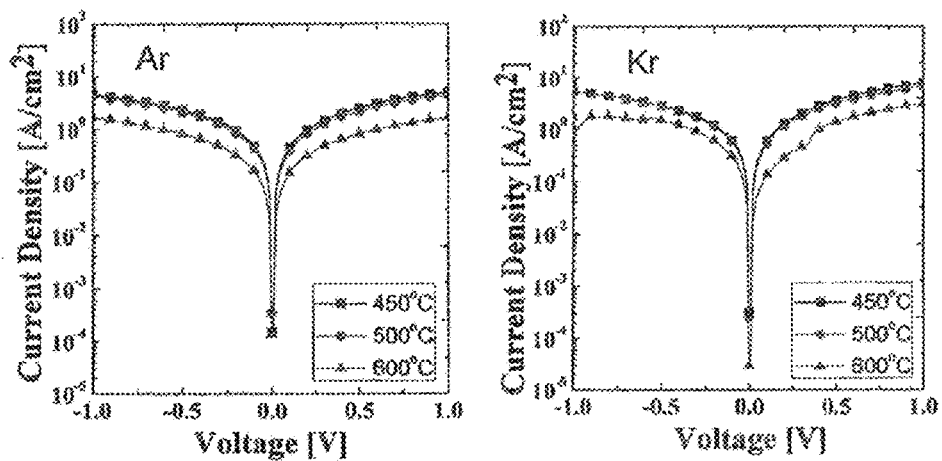
FIG. 2 shows a J-V characteristic of the device (PtHf silicide alloy film) produced in the first embodiment.
Figure 3:
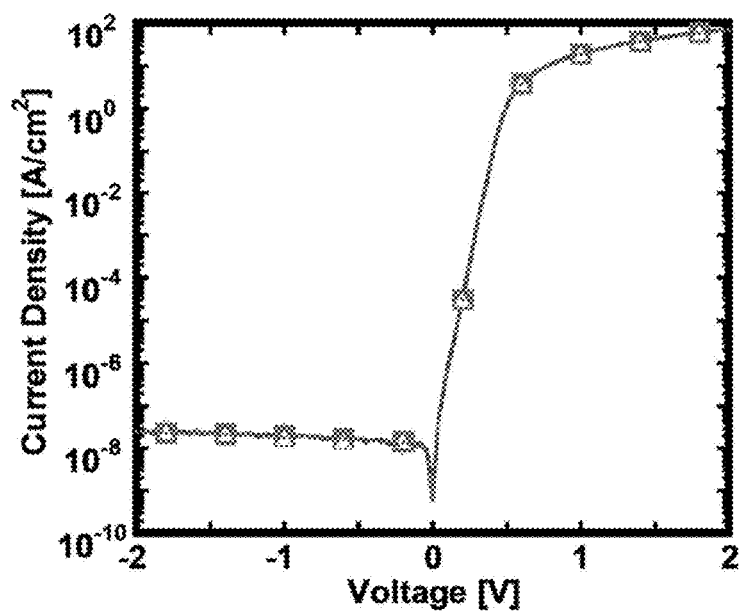
FIG. 3 shows a J-V characteristic of a device (Pt silicide film) produced in Comparative Example 1.

FIG. 2 shows the J-V characteristic of the device (PtHf silicide alloy film) produced in the first embodiment. The result in FIG. 2 shows that in the device produced in this embodiment, the current density linearly increased in application of a voltage in both a forward direction and a reverse direction (positive direction and negative direction). In this embodiment, the substrate is an n-Si substrate, and thus a behavior at a negative potential is important. The device of this embodiment can be said to have exhibited a favorable characteristic. On the other hand, FIG. 3 shows a J-V characteristic in Comparative Example 1. In Comparative Example 1, the current density did not increase in application of a negative potential.

For the PtHf silicide alloy film according to this embodiment, a device with a favorable behavior was obtained at any of the treatment temperatures regarding the temperature for silicidation. Among devices subjected to an Ar sputtering treatment, a device treated at 450° C. had a high current density. Among devices subjected to a Kr sputtering treatment, a device treated at 450° C. had a high current density.

A Schottky barrier height of each silicide alloy film was calculated from the measured J-V characteristic. These Schottky barrier heights are collectively shown in Table 1 below. Table 1 shows that the Schottky barrier height of the PtHf silicide in this embodiment was 0.47 to 0.51 eV, whereas the Schottky barrier height of the Pt silicide in the comparative example was 0.85 eV (Ar sputtering). The difference between the Schottky barrier heights of the silicides is associated with the work function of a metal to be silicified, and it can be said that the silicide in the comparative example had a high Schottky barrier height because of the high work function of Pt.

TABLE 1

| | Schottky barrier height | |
| --- | --- | --- |
| | Ar | Kr |
| 450° C. | 0.48 eV | 0.47 eV |
| 500° C. | 0.48 eV | 0.48 eV |
| 600° C. | 0.51 eV | 0.51 eV |

Figure 4:
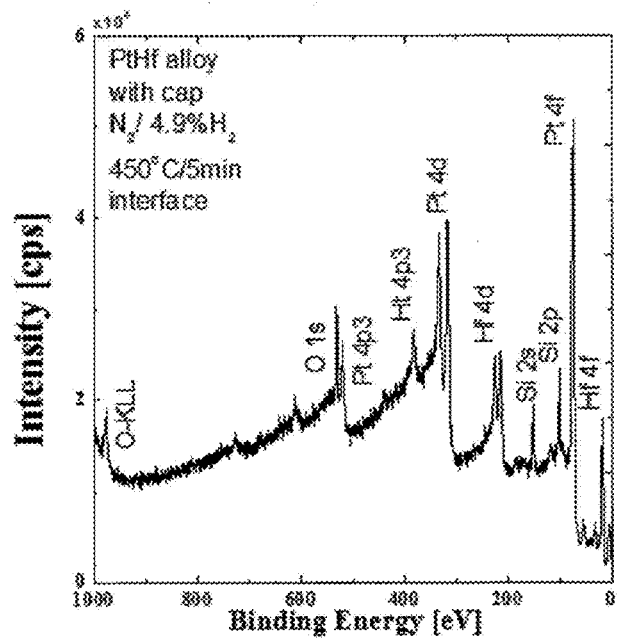
FIG. 4 shows results of analysis of the PtHf silicide alloy film of the first embodiment by XPS.

Here, composition analysis was performed by use of XPS for the PtHf silicide alloy film (heat treatment temperature: 450° C.). The measurement results are shown in FIG. 4. For the analysis result, a composition ratio was calculated from a peak area attributed to each element, and the result showed that the composition ratio was Pt:Hf:Si=30:20:50 (atom ratio). The content of impurities was confirmed to be 2.05 wt % for oxygen and 0.14 wt % or less (below detection limit) for carbon. The difference between the ratio of Pt and Hf in the silicide film and the composition ratio (Pt:Hf=5:2) in the PtHf alloy as a target is ascribable to composition deviation of formed silicides due to a difference between the vapor pressures of Pt and Hf and a difference between the diffusion speeds of Pt and Hf to the Si substrate.

Figure 5:
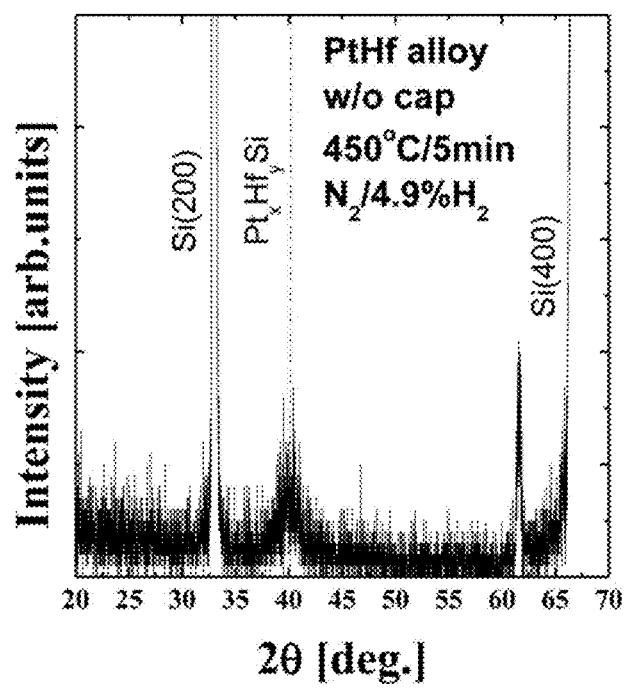
FIG. 5 shows results of analysis of the PtHf silicide alloy film of the first embodiment by XRD.

The results of X-ray diffraction analysis (XRD) of the PtHf silicide alloy film (heat treatment temperature: 450° C.) of this embodiment are shown in FIG. 5. The silicide alloy film clearly presents a peak of a mixed crystal ($Pt_xHf_ySi$), but presents little peaks of individual silicides (PtSi and HfSi) of the metals of Pt and Hf. The peak intensity ratio ((Y+Z)/X) of the silicides was about 0.05.

Further, for the PtHf silicide alloy film (heat treatment temperature: 450° C.), a root mean square (RMS) roughness was measured (scan width: 3 μm) by an AFM (atomic force microscope), the result showed that the surface of a film deposited by Ar sputtering had a RMS of 2.16 nm. The surface of a film deposited by Kr sputtering was 0.45 nm. Both the films showed a favorable surface form. The Pt silicide film of the comparative example had a RMS of 6.40 nm.

Second Embodiment

For conditions for silicidation of the PtHf alloy thin-film, a test for evaluating heat resistance in application of a high-temperature treatment was conducted. A chemically cleaned n-Si (111) substrate was provided, and a PtHf alloy thin-film was formed under the same conditions as in the first embodiment (preliminary sputtering done, thickness: 20 nm). The alloy thin-film was heat-treated at respective temperatures of 400° C., 500° C. and 600° C., and etched with a diluted aqua regia to prepare samples. For these samples, sheet resistance was measured by a four-probe measurement method.

Figure 6:
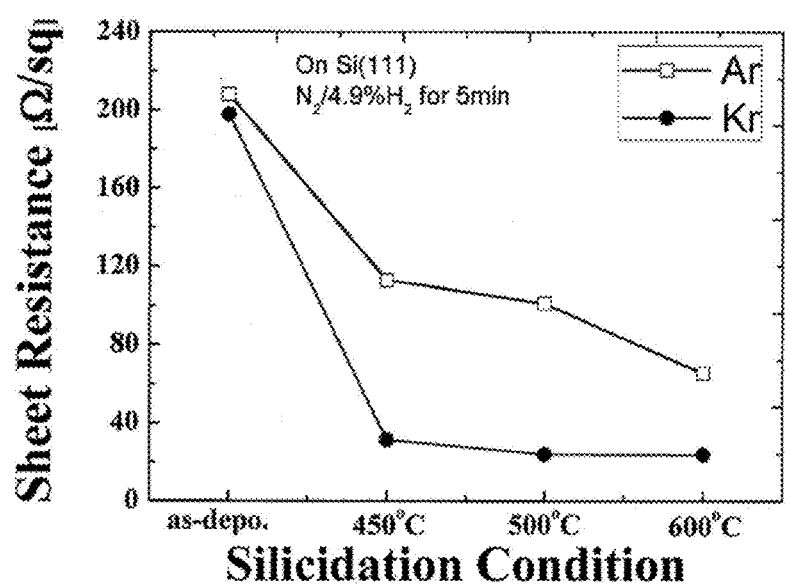
FIG. 6 shows results of measuring sheet resistance of a silicide electrode when a heat treatment temperature for silicidation is changed.

The measurement results are shown in FIG. 6. The PtHf alloy thin-film has high sheet resistance just after being deposited, but the sheet resistance is decreased by silicidation. The sheet resistance of the silicide remains low even when the silicide is treated at a high temperature of 600° C. Thus, it was confirmed that PtHf had favorable thermal stability, and the resistance of PtHf did not increase even at a high temperature.

Third Embodiment

Figure 7:
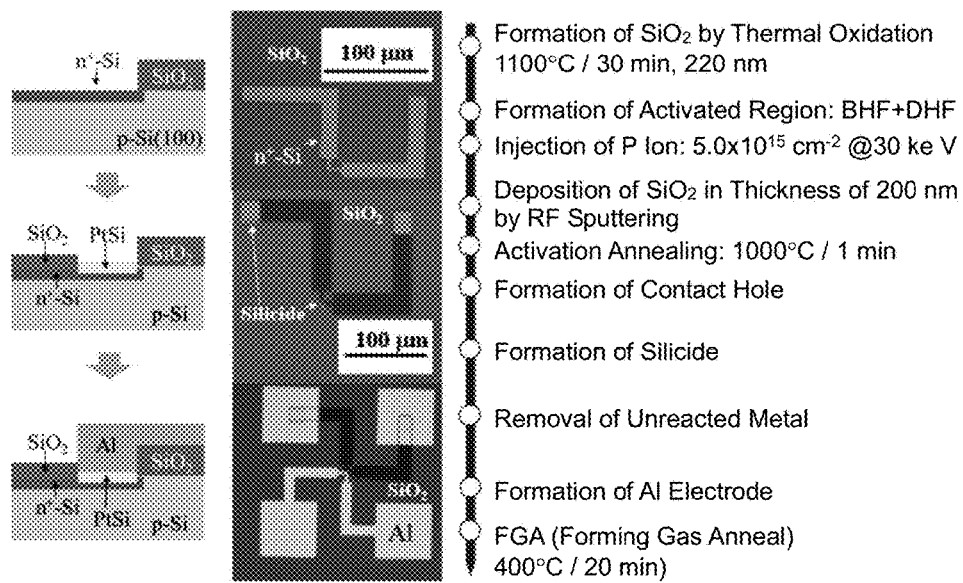
FIG. 7 illustrates a process for forming a CBKR structure.

Here, for the PtHf silicide alloy film, contact resistance (interface contact resistance) in a four-terminal Kelvin test structure was evaluated by a cross-bridge Kelvin resistance method (hereinafter, referred to as a CBKR method) for reproduction and evaluation of a state closer to that in semiconductor device packaging. FIG. 7 schematically illustrates a process for forming a CBKR structure.

Figure 8:
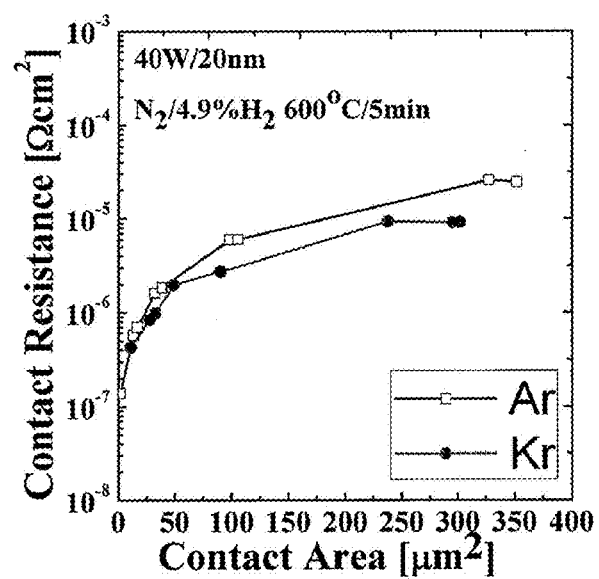
FIG. 8 shows results of measuring contact resistance of a PtHf silicide alloy film by a CBKR method.

FIG. 8 shows results of measuring contact resistance with a contact area for the PtHf silicide alloy film by a CBKR method. From the evaluation results, it is understood that the PtHf silicide alloy film of 2 μm square attains a low contact resistance of $8 \times 10^{-8}$ Ωcm. It was confirmed that the PtHf silicide alloy film was expected to be applied to an actual device.

Fourth Embodiment

In this embodiment, an IrYb silicide ($Ir_xYb_ySi$) alloy film having Ir (work function: 5.27 eV) as a metal M1 and Yb (work function: 2.6 eV) as a metal M2 was produced. Specifically, as with the first embodiment, a Schottky diode including an electrode composed of an IrYb silicide thin-film on a Si substrate was produced, and the electrical property of the device was evaluated.

The process for producing the device is essentially the same as in the first embodiment (FIG. 1). The Si substrate (n-Si (100)) was chemically cleaned, and a $SiO_2$ layer was then formed, and etched to perform patterning. A Yb thin-film was deposited in the layer, an Ir thin-film was then deposited, and a heat treatment was performed to form an IrYb silicide alloy film.

For formation of the Yb thin-film and the Ir thin-film, targets including metals of Ir and Yb, respectively, were used. For production of the thin-film, a cast ingot of Yb was cold-rolled, annealed and mechanically processed to be finally finished, so that a Yb molten target (dimensions: a diameter of 76.1 mm and a thickness of 2 mm) was provided. Further, an Ir cast ingot obtained by plasma melting was hot-forged, hot-rolled, laser-cut, and finally finished by trimming and polishing to provide an Ir molten target.

In formation of the Yb thin-film and the Ir thin-film, first a substrate surface was cleaned by performing preliminary sputtering (power: 100 W, time: 5 minutes). The Yb thin-film and the Ir thin-film were deposited at a Kr gas pressure of 0.65 Pa by RF magnetron sputtering. As conditions for deposition of the Yb thin-film, the temperature was room temperature, and the power was 180 W, and under the conditions, Yb was deposited in a thickness of 6 nm. As conditions for deposition of the Ir thin-film subsequent to deposition of Yb, the temperature was room temperature, and the power was 80 W, and under the conditions, the Ir thin-film was deposited in a thickness of 14 nm.

In this embodiment, after formation of the Yb thin-film and the Ir thin-film, a cap layer including a HfN thin-film was formed on the thin-film, and a heat treatment was then performed to form a silicide alloy film. For formation of the cap layer, a Hf target was used, and the cap layer (thickness: 10 nm) was deposited by reactive sputtering with $Kr/N_2$ as a deposition atmosphere (RF magnetron sputtering, room temperature, power: 200 W). As conditions for silicidation, the treatment temperature was 500° C., the treatment atmosphere was a nitrogen gas atmosphere, and the treatment time was 1 minute. After the silicidation, the cap layer and an unreacted metal were removed by etching, and an Al electrode was formed to obtain a device.

Comparative Example 2

As a comparative example to the fourth embodiment, only an Ir thin-film was formed, and silicified to produce a device.

Conditions for deposition of the Ir thin-film, conditions for silicidation, and so on were the same as in the fourth embodiment.

Figure 9:
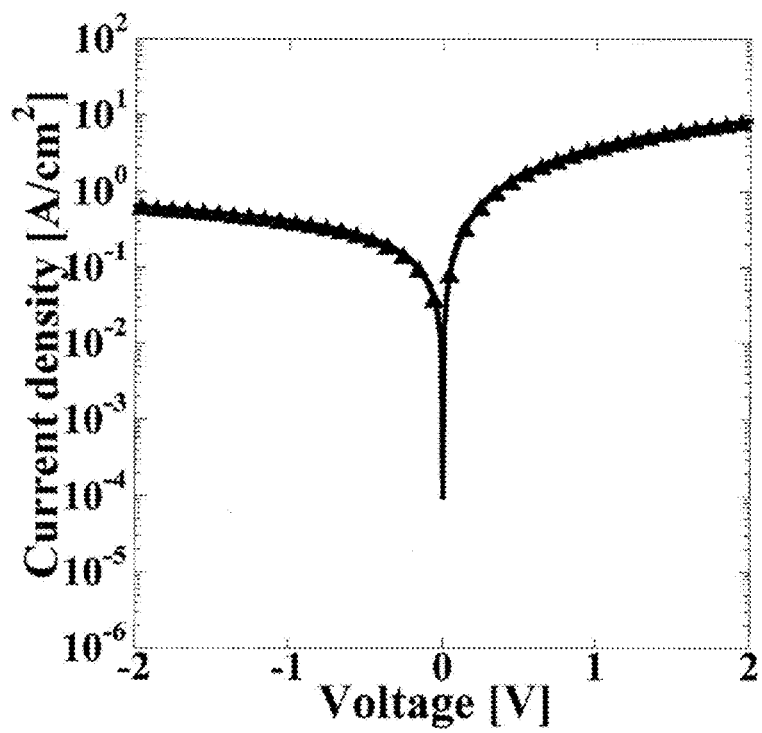
FIG. 9 shows a J-V characteristic of a device (IrYb silicide alloy film) produced in a fourth embodiment.
Figure 10:
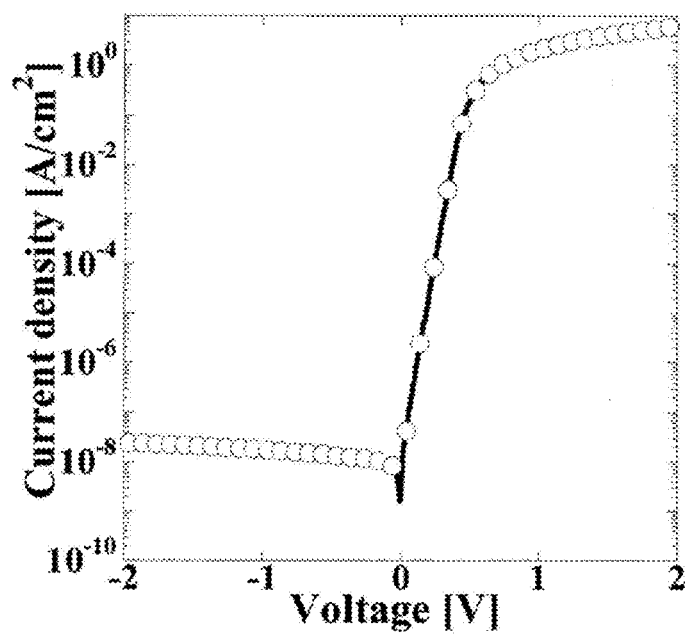
FIG. 10 shows a J-V characteristic of a device (Ir silicide film) produced in Comparative Example 2.

FIG. 9 shows a J-V characteristic of a device (IrYb silicide alloy film) produced in a fourth embodiment. The current density linearly increased in application of a voltage in both a forward direction and a reverse direction (positive direction and negative direction). On the other hand, FIG. 10 shows a J-V characteristic of the device in Comparative Example 2. The current density did not increase in application of a negative potential.

The measured J-V characteristic showed that the silicide alloy film (IrYb silicide alloy film) of the fourth embodiment had a Schottky barrier height of 0.47 eV. On the other hand, the silicide alloy film (Ir silicide alloy film) of Comparative Example 2 had a Schottky barrier height of 0.89 eV. It was confirmed that the Ir silicide film of Comparative Example 2 had a high Schottky barrier height because of the high work function of Ir, and the Schottky barrier height decreased in the fourth embodiment where Ir was alloyed with Yb.

The sheet resistance of the silicide film of each of the fourth embodiment and Comparative Example 2 was measured by a four-probe measurement method, and the result showed that the sheet resistance in the fourth embodiment was 63.0 Ω/sq, and the sheet resistance in Comparative Example 2 was 63.6 Ω/sq. Therefore, it was confirmed that the sheet resistance in the fourth embodiment was slightly lower than that in Comparative Example 2.

Figure 11:
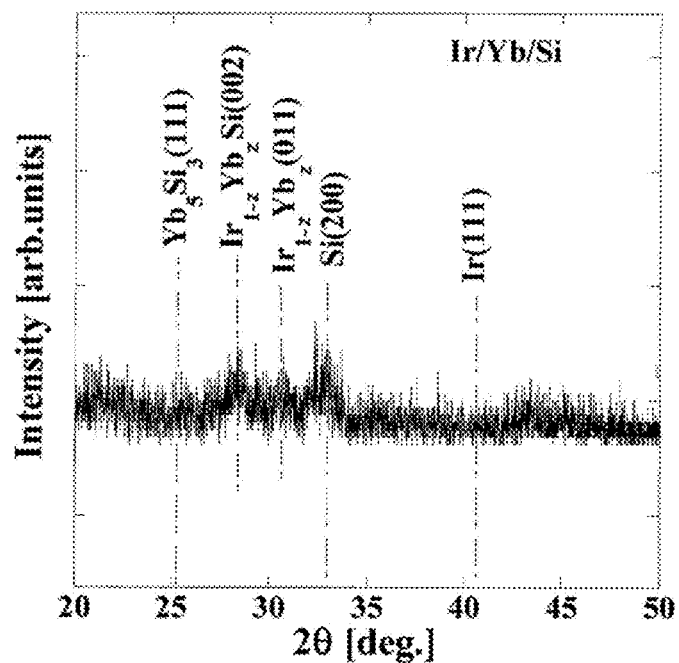
FIG. 11 shows results of analysis of the IrYb silicide alloy film of the fourth embodiment by XRD.

Next, FIG. 11 shows results of XRD of the IrYb silicide alloy film of the fourth embodiment. The silicide alloy film presents a peak of an alloy of Yb and Ir in addition to a peak of $Ir_xYb_ySi$ (y=z and x=1−z) as a mixed crystal. Further, a peak of a silicide ($Yb_5Si_3$) of Yb slightly appears. In this embodiment, the peak intensity ratio ((Y+Z)/X) of the silicides was about 0.05.

The $Ir_xYb_ySi$ mixed crystal observed in the XRD was a mixed crystal ($Ir_{1−z}Yb_zSi$) formed with Yb replacing some Ir sites of a silicide (IrSi) of Ir. Here, when assuming that the mixed crystal has the same structure as that of an IrSi orthorhombic crystal, the composition ratio of the alloy film was supposed to be Ir:Yb:Si=43.8:6.2:50 (atom ratio).

Fifth Embodiment

In this embodiment, a device including a PdYb silicide ($Pd_xYb_ySi$) alloy film having Pd (work function: 4.9 eV) as a metal M1 and Yb (work function: 2.6 eV) as a metal M2 was produced. A Si substrate provided in the same manner as in the fourth embodiment, a Yb thin-film was deposited, a Pd thin-film was then deposited, and a heat treatment was performed to form a PdYb silicide alloy film.

For formation of the Yb thin-film and the Pd thin-film, targets including metals of Pd and Yb, respectively, were used. As the Yb target, a Yb target identical to that in the fourth embodiment was used. Further, a Pd cast ingot obtained by air melting was hot-forged, hot-rolled, laser-cut, and finally finished by trimming and polishing to provide a Pd molten target. The Yb thin-film and the Pd thin-film were deposited at a Kr gas pressure of 0.65 Pa by RF magnetron sputtering. Conditions for deposition of the Yb thin-film include room temperature and power of 180 W, and under the conditions, Yb was deposited in a thickness of 6 nm. Conditions for deposition of the Pd thin-film subsequent to deposition of Yb include room temperature and power of 80 W, and under the conditions, the Pd thin-film was deposited in a thickness of 14 nm.

As with the fourth embodiment, silicidation was performed by heat treatment after formation of the Yb thin-film and the Pd thin-film, and formation of a cap layer. As conditions for silicidation, the treatment temperature was 500° C., the atmosphere was a nitrogen gas atmosphere, and the treatment time was 1 minute. After the silicidation, the cap layer and an unreacted metal were removed by etching, and an Al electrode was formed to obtain a device.

Comparative Example 3

As a comparative example to the fifth embodiment, only a Pd thin-film was formed, and silicified to produce a device. Conditions for deposition of the Pd thin-film, conditions for silicidation, and so on were the same as in the fifth embodiment.

Figure 12:
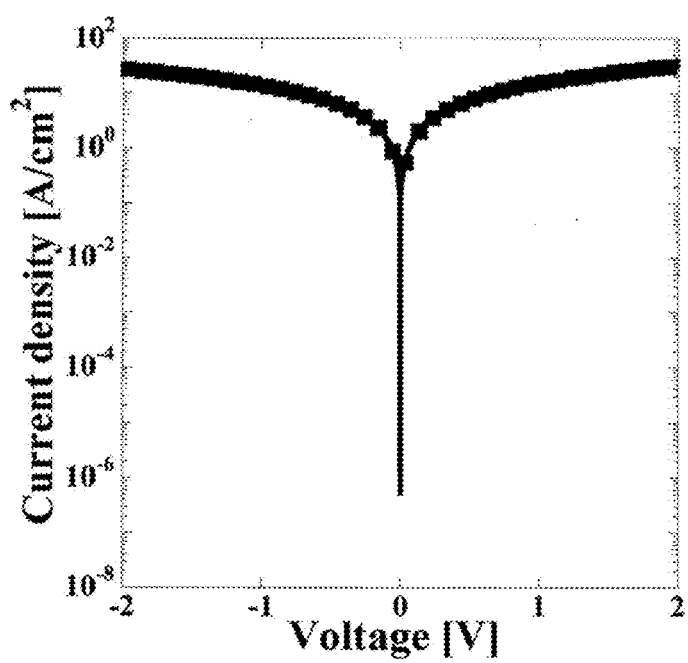
FIG. 12 shows a J-V characteristic of a device (PdYb silicide alloy film) produced in a fifth embodiment.
Figure 13:
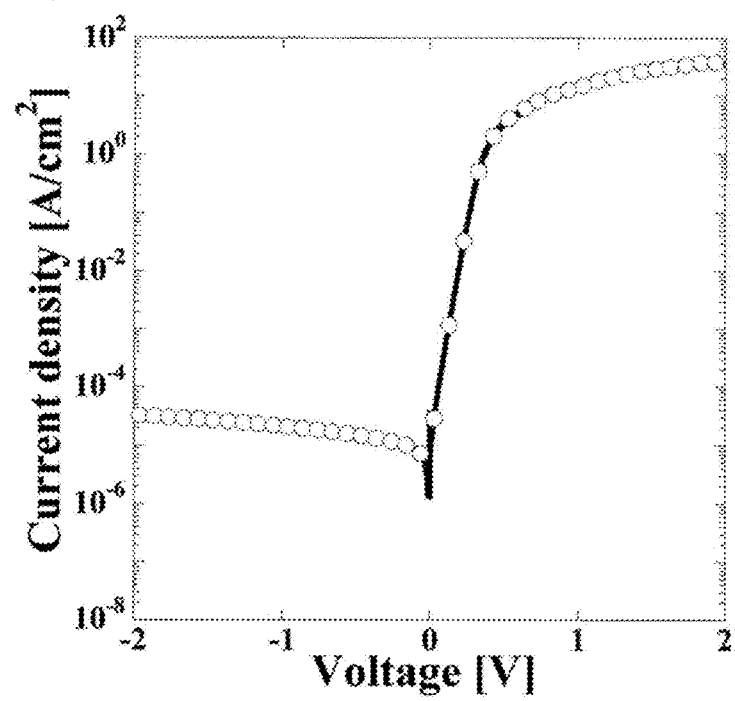
FIG. 13 shows a J-V characteristic of a device (Pd silicide film) produced in Comparative Example 3.

FIG. 12 shows a J-V characteristic of the device (PdYb silicide alloy film) produced in a fifth embodiment. FIG. 13 shows a J-V characteristic of the device of Comparative Example 3. In the device of this embodiment, the current density linearly increased in application of a voltage in both a forward direction and a reverse direction (positive direction and negative direction). On the other hand, in the device of Comparative Example 3, the current density did not increase in application of a negative potential.

The measured J-V characteristic showed that the silicide alloy film (PdYb silicide alloy film) of the fifth embodiment had a Schottky barrier height of 0.4 eV. On the other hand, the silicide alloy film (Pd silicide alloy film) of Comparative Example 3 had a Schottky barrier height of 0.73 eV. It was confirmed that the Pd silicide film of Comparative Example 3 had a high Schottky barrier height because of the high work function of Pd, and the Schottky barrier height decreased in the fifth embodiment where Pd was alloyed with Yb.

The sheet resistance of the silicide film of each of the fifth embodiment and Comparative Example 3 was measured by a four-probe measurement method, and the result showed that the sheet resistance in the fifth embodiment was 20.9 Ω/sq, and the sheet resistance in Comparative Example 3 was 27 Ω/sq. Therefore, it was confirmed that the sheet resistance in the fifth embodiment was lower than that in Comparative Example 3.

Figure 14:
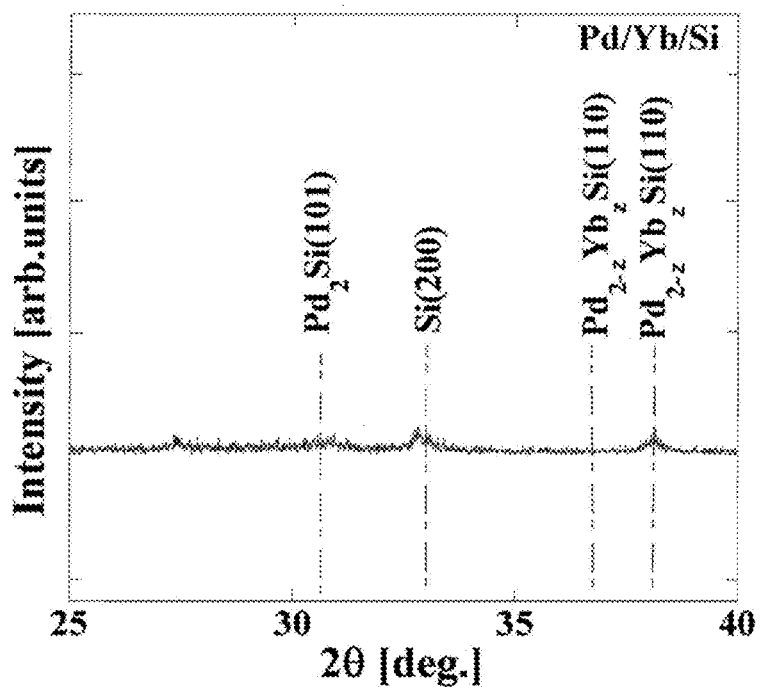
FIG. 14 shows results of analysis of the PdYb silicide alloy film of the fifth embodiment by XRD.

Next, FIG. 14 shows results of XRD of the PdYb silicide alloy film of the fifth embodiment. The silicide alloy film presented a peak of $Pd_xYb_ySi$ (y=z and x=2−z) as a mixed crystal. A peak of a silicide ($Pd_2Si$) of Pd slightly appears. In this embodiment, the peak intensity ratio ((Y+Z)/X) of the silicides was about 0.05.

The $Pd_xYb_ySi$ mixed crystal observed in the XRD was a mixed crystal ($Pd_{2−z}Yb_zSi$) formed with Yb replacing some Pd sites of a silicide ($Pd_2Si$) of Pd. Here, when assuming that the mixed crystal has the same structure as that of a $Pd_2Si$ hexagonal crystal, the composition ratio of the alloy film was supposed to be Pd:Yb:Si=57.8:8.9:33.3 (atom ratio).

Sixth Embodiment

In this embodiment, a PdEr silicide ($Pd_xEr_ySi$) alloy film having Pd (work function: 4.9 eV) as a metal M1 and Er (work function: 3.2 eV) as a metal M2 was produced. Here, a sintered target including a PdEr alloy was used to deposit a PdEr alloy thin-film, a heat treatment for silicidation was then performed, and whether silicidation was possible or not was checked.

The sintered target including a PdEr alloy was obtained by sintering a fine powder of a PdEr alloy. The PdEr alloy powder was produced by arc-melting and alloying high-purity base metals of Pd and Er to produce a button-shaped ingot, and mechanically crushing the ingot into a powder. The alloy composition ratio here is Pd:Er=3:2 (at %). The alloy powder was sintered under the condition of 255 kgf/cm$^2$, 1140° C. and 1 hour in a HIP apparatus to obtain an alloy target (dimensions: a diameter of 76.0 mm and a thickness of 3.0 mm).

In formation of the PdEr alloy thin-film, first a surface of an n-Si (100) substrate was cleaned by performing preliminary sputtering (power: 200 W, time: 30 minutes). Thereafter, the PdEr alloy film was sputtered. Conditions include room temperature, power of 80 W, pressure of 0.65 Pa, and a Kr gas as a sputtering gas. Under the above conditions, the PdEr alloy thin-film was deposited in a thickness of 20 nm.

After formation of the PdEr alloy thin-film, the HfN cap layer was formed, and a heat treatment was performed to silicify the PdEr alloy thin-film. For formation of the cap layer, a Hf target was used, and the cap layer (thickness: 20 nm) was deposited by reactive sputtering with Kr/N$_2$ as a deposition atmosphere (RF magnetron sputtering, room temperature, power: 200 W). The silicidation was performed at a treatment temperature of 550° C. in a nitrogen gas as a treatment atmosphere for a treatment time of 30 minutes. After the silicidation treatment, the cap layer and an unreacted metal were removed by etching.

Figure 15:
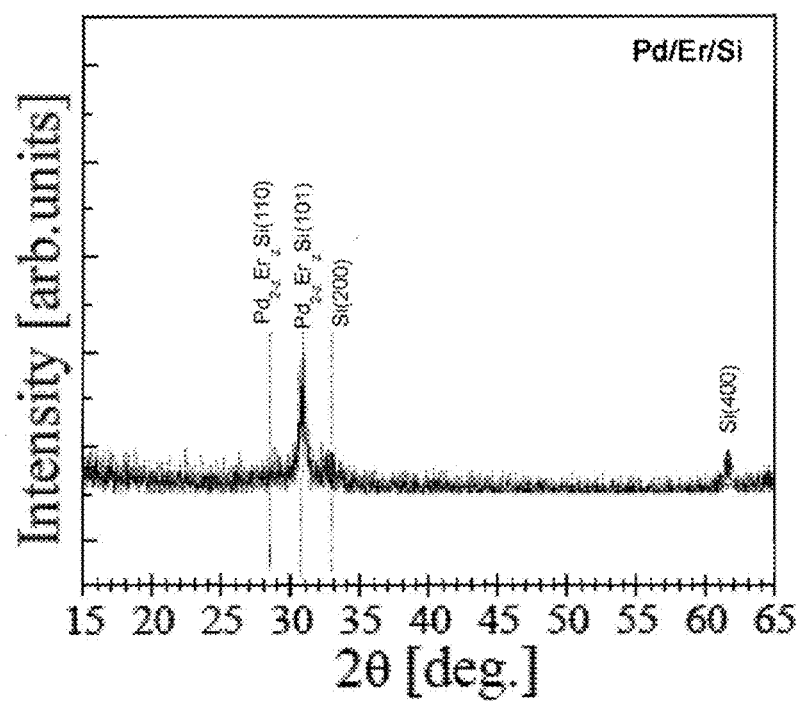
FIG. 15 shows results of analysis of a PdEr silicide alloy film of the sixth embodiment by XRD.

FIG. 15 shows results of XRD of the PdEr silicide alloy film produced in the above-mentioned process. The silicide alloy film presented an intense peak of Pd$_x$Er$_y$Si (y=z and x=2−z) as a mixed crystal. The peaks of the Pd silicide and the Er silicide were extremely weak. In this embodiment, the peak intensity ratio ((Y+Z)/X) of the silicides was less than 0.01. The Pd$_x$Er$_y$Si mixed crystal observed in the XRD was a mixed crystal (Pd$_{2-z}$Er$_z$Si) formed with Er replacing some Pd sites of a silicide (Pd$_2$Si) of Pd. Here, when assuming that the mixed crystal has the same structure as that of a Pd$_2$Si hexagonal crystal, the composition ratio of the alloy film was supposed to be Pd:Er:Si=40:26.7:33.3 (atom ratio).

INDUSTRIAL APPLICABILITY

The silicide alloy film according to the present invention includes a silicide of a metal M1 and a metal M2 having mutually different work functions, and has favorable thermal stability. Moreover, the silicide alloy film has a work function in the vicinity of midgap with respect to a Si substrate. The silicide alloy film according to the present invention is useful as a constituent material of a silicide electrode in various kinds of semiconductor devices such as a MOSFET.

The invention claimed is:

1. A silicide alloy film that is formed on a substrate containing Si: comprising, a metal M1 having a work function of 4.6 eV or more and 5.7 eV or less, a metal M2 having a work function of 4.0 eV or less, and Si having a work function of 4.3 eV or more and 4.9 eV or less; and in a relationship of the peak intensity (X) of a diffraction peak of a mixed crystal (M1$_x$M2$_y$Si) including the metal M1, the metal M2 and Si, the peak intensity (Y) of a diffraction peak of a silicide (M1$_a$Si) of the metal M1 and the peak intensity (Z) of a diffraction peak of a silicide (M2$_b$Si) of the metal M2, which are observed by X-ray diffraction analysis, the ratio ((Y+Z)/X) of the sum of Y and Z to X is 0.1 or less, wherein M1 is Pt and M2 is Hf.

2. The silicide alloy film according to claim 1, wherein the content of Si is 33 at % or more and 50 at % or less.

3. The silicide alloy film according to claim 1, wherein the total concentration of C and O as impurities is 5% by mass or less.

4. The silicide alloy film according to claim 1, wherein the root mean surface roughness (RMS) is 5 nm or less.

5. A method for producing the silicide alloy film according to claim 1, comprising forming on a Si substrate a thin-film including the metal M1 and the metal M2, and then heat-treating the Si substrate to silicify the metal M1 and the metal M2.

* * * * *